(12) United States Patent
Watanabe et al.

(10) Patent No.: US 11,385,714 B2
(45) Date of Patent: Jul. 12, 2022

(54) MAGNETIC DEFORMABLE MEMBER

(71) Applicant: SEKISUI POLYMATECH CO., LTD., Saitama (JP)

(72) Inventors: Yasuyoshi Watanabe, Saitama (JP); Hiromi Suda, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 548 days.

(21) Appl. No.: 16/368,407

(22) Filed: Mar. 28, 2019

(65) Prior Publication Data

US 2020/0192482 A1    Jun. 18, 2020

Related U.S. Application Data

(63) Continuation-in-part of application No. 16/218,745, filed on Dec. 13, 2018.

(51) Int. Cl.
*G06F 3/01* (2006.01)
*G06F 3/041* (2006.01)
*G06F 3/0488* (2022.01)
*G06F 3/044* (2006.01)
*H01L 41/12* (2006.01)
(Continued)

(52) U.S. Cl.
CPC .............. *G06F 3/016* (2013.01); *G06F 3/044* (2013.01); *G06F 3/0414* (2013.01); *G06F 3/0488* (2013.01); *H01L 41/125* (2013.01); *H01L 41/20* (2013.01); *H01L 41/47* (2013.01); *G06F 3/04142* (2019.05);
(Continued)

(58) Field of Classification Search
CPC ....... H01L 41/125; H01L 41/47; H01L 41/20; H01L 41/12; G06F 3/0488; G06F 3/016; G06F 3/044; G06F 3/0414; G06F 2203/04102; G06F 3/04142; G06F 2203/04809
See application file for complete search history.

(56) References Cited

U.S. PATENT DOCUMENTS

2009/0250267 A1   10/2009  Heubel et al.
2012/0098789 A1   4/2012   Ciesla et al.
(Continued)

FOREIGN PATENT DOCUMENTS

JP   2012-125136 A    6/2012
JP   2013-543184 A    11/2013
(Continued)

*Primary Examiner* — Yaron Cohen
(74) *Attorney, Agent, or Firm* — Buchanan, Ingersoll & Rooney PC

(57) ABSTRACT

There is provided a magnetic deformable member that is deformable upon application of magnetism, and that has a front surface that projects toward the side opposite to a magnet when such a magnet is placed. The front surface provides variations in tactile feel or viewability for humans by providing a soft tactile feel. A magnetic deformable member includes: a flexible sheet; a back plate made of a hard material and stacked on the flexible sheet; a gel charged inside a space between the flexible sheet and the back plate; and a magnetic member having an annular shape as viewed in plan in a direction that is perpendicular to a front surface of the flexible sheet and having a length in the perpendicular direction. The magnetic member is secured to the flexible sheet, and disposed in the gel.

18 Claims, 7 Drawing Sheets

(51) Int. Cl.
*H01L 41/20* (2006.01)
*H01L 41/47* (2013.01)
(52) U.S. Cl.
CPC ............ *G06F 2203/04102* (2013.01); *G06F 2203/04809* (2013.01); *H01L 41/12* (2013.01)

(56) References Cited

U.S. PATENT DOCUMENTS

2014/0160064 A1* 6/2014 Yairi .................. G06F 3/04883
 345/174
2016/0011684 A1* 1/2016 Zhang .................... G06F 3/041
 345/173

FOREIGN PATENT DOCUMENTS

JP  2015-179544 A  10/2015
WO  2014/134962 A1  9/2014

* cited by examiner

MAGNETIC DEFORMABLE MEMBER

BACKGROUND OF THE INVENTION

1. Field of the Invention

The present invention relates to a magnetic deformable member that includes a front surface that provides variations in a tactile feel or viewability for humans.

2. Description of the Related Art

It has hitherto been known to use a magnetic elastic body, which is a flexible elastic body containing a magnetic material, for an actuator by utilizing the nature of the magnetic elastic body that its shape is varied upon application of a magnetic field. For example, Japanese Unexamined Patent Application Publication No. 2012-125136 describes a technology related to a magnetically responsive actuator that is expandable and contractible in accordance with the strength of a magnetic field. The publication mentions a massaging machine as a specific example of application of a magnetic elastic body, and describes the relationship between the magnetic field and deformation of the magnetic elastic body in detail.

As examples of a device that is variable in shape by a magnetic field, International Publication No. 2014/134962 describes a device which has a feedback function and in which an armature portion is stacked on the back surface of a flexible touch screen, and Japanese Unexamined Patent Application Publication No. 2015-179544 describes a device that uses a magnetic flowing fluid that is deformable by a magnetic force. Further, Japanese Unexamined Patent Application Publication (Translation of PCT Application) No. 2013-543184 describes a technique of deforming an outer shape of a front surface with a fluid moving to a tactile surface through a fluid port.

SUMMARY OF THE INVENTION

Problems to be Solved by the Invention

As typically indicated by the technology described in Japanese Unexamined Patent Application Publication No. 2012-125136, however, if it is attempted to utilize deformation of a magnetic elastic body in a part to be contacted by humans, a magnet cannot be disposed on a contact surface, and thus it is necessary to dispose the magnet on the side opposite to the contact surface. When the magnetic elastic body is deformed in such an arrangement, the magnetic elastic body is attracted by the magnet when a magnetic field is applied, and thus it is difficult to project the magnetic elastic body significantly, although the magnetic elastic body is easily deformable in the recessing direction. In addition, the magnetic elastic body becomes hard upon application of a magnetic field by nature, and thus it is difficult to keep the deformed portion flexible.

Also in the technology described in International Publication No. 2014/134962, the armature portion is a hard object such as a permanent magnet, and therefore the front surface of the touch screen on which the armature portion is stacked does not provide a soft tactile feel. Also in the case where a magnetic flowing fluid is used, the magnetic flowing fluid is attracted by a magnetic field when the magnetic field is applied as in the technology described in Japanese Unexamined Patent Application Publication No. 2015-179544, and thus it is difficult to project the device significantly, although the device is easily deformable in the recessing direction. After the magnetic field is removed, the gravitational force recovers the original state, and the container itself is urged to recover the original shape. However, the magnetic flowing fluid itself does not recover the initial shape by nature, and therefore the outer shape which has been deformed by the magnetic field does not completely recover the original flat state when application of the magnetic field is removed. In the technique described in Japanese Unexamined Patent Application Publication (Translation of PCT Application) No. 2013-543184, a structure for storing the fluid to be moved and a pump for moving the fluid are required, which complicates the mechanism.

The present invention has been made to address the foregoing issue. That is, it is an object of the present invention to provide a magnetic deformable member that is deformable upon application of magnetism, and that has a front surface that projects toward the side opposite to a magnet when such a magnet is placed, the front surface providing variations in a tactile feel or viewability for humans by providing a soft tactile feel.

Means for Solving the Problems

In order to achieve the foregoing object, the present invention provides a magnetic deformable member configured as follows. That is, the present invention provides a magnetic deformable member including: a flexible sheet; a back plate made of a hard material; a gel charged between the flexible sheet and the back plate; and a magnetic member held on the flexible sheet and disposed in the gel, the magnetic member having an annular shape as viewed in plan in a direction that is perpendicular to the flexible sheet and having a length in the perpendicular direction.

With the present invention configured as described above, a swell can be formed inside an annular portion of the flexible sheet which holds the annular magnetic member. In addition, such a swell can be formed as a projected portion with a soft, comfortable tactile feel.

That is, when a magnet is disposed on the outer side of the back plate to apply a magnetic field, for example, the magnetic member is drawn by the magnetic field, and the magnetic member is displaced in the gel. On the other hand, the gel in the annular magnetic member is not affected by the magnetic field. Therefore, when the magnetic member is displaced toward the back plate, the gel inside the annular shape is displaced toward the flexible sheet relative to the magnetic member. Therefore, while the flexible sheet is drawn toward the back plate by the magnetic member at a portion at which the flexible sheet is secured to the magnetic member, the flexible sheet is lifted toward the side opposite to the back plate by the gel inside the annular shape. Therefore, the flexible sheet rises inside the annular shape so that a projected portion is formed on the front surface of the flexible sheet. Such a projected portion is formed from the flexible sheet with a soft front surface, and contains the gel inside, and therefore can provide a soft tactile feel. In other words, the magnetic member is formed in an annular shape as viewed in plan in a direction that is perpendicular to the front surface of the flexible sheet, and therefore a stress received by the internal gel which is disposed inside the annular shape because of deformation of the magnetic member efficiently acts on the flexible sheet to project the front surface thereof.

The magnetic member may have an endless annular shape. Since the magnetic member has an endless annular shape, the effect of compressing the gel which is positioned inside the annular shape can be enhanced to increase the degree of swelling of the front surface of the flexible sheet, compared to a case where the magnetic member has an ended annular shape.

The magnetic member may include a plurality of magnetic pieces arranged in an annular shape. Since the magnetic member includes a plurality of magnetic pieces arranged in an annular shape, the magnetic member can be divided into a plurality of magnetic pieces, with no need to provide a single large magnet. In addition, the plurality of magnetic pieces can be disposed with spacing therebetween, and therefore the annular shape can be reduced in size even if the individual magnetic pieces are rigid. Consequently, the effect of compressing the gel in the annular shape can be enhanced to increase the degree of swelling of the front surface of the flexible sheet.

In the present invention, the magnetic member may be a deformable elastic member disposed in contact with the back plate. Since the magnetic member is a deformable elastic member disposed in contact with the back plate, it can be made difficult for the gel which is located in the annular magnetic member to flow out of the annular shape, which makes it easy for the stress of the gel which is located in the annular shape to be compressed to act on the front surface of the flexible sheet. Since the magnetic member is a deformable elastic member, in addition, the magnetic member is compressed when a magnetic field is applied to the magnetic member. Consequently, a portion of the flexible sheet at which the flexible sheet is secured to the magnetic member can be displaced toward the magnet relative to a surrounding portion of the flexible sheet.

In the present invention, the magnetic deformable member may further include a magnetic force generation member provided on an outer side of the back plate to attract the magnetic member using a magnetic force. Since the magnetic force generation member is provided on the outer side of the back plate, the magnetic force generation member which is disposed on the outer side of the back plate can exert its magnetic force to attract and displace the magnetic member toward the magnetic force generation member, and to deform the magnetic member. Consequently, the front surface of the flexible sheet can be deformed in outer shape such that the side opposite to the side on which the magnetic force generation member is disposed, that is, a portion of the front surface of the flexible sheet at which the magnetic member is located, is sunk toward the back plate and a portion thereof at which the magnetic member is not located is swelled relatively. Examples of the magnetic force generation member include a permanent magnet and an electromagnet that can be electrically turned on and off to generate a magnetic force.

In the present invention, the magnetic force generation member may be smaller in outer dimensions than the magnetic member as viewed in plan. Since the magnetic force generation member is smaller in outer dimensions than the magnetic member as viewed in plan, the magnetic member can not only be simply drawn downward but also displaced in the diameter reducing direction when the magnetic member is attracted by the magnetic force generation member which is smaller in outer dimensions. Consequently, firstly, the internal gel is compressed to a greater degree, and a larger projected portion can be formed on the front surface of the flexible sheet. Secondly, a compressive stress on the gel outside the annular shape of the magnetic member can be reduced to reduce the amount of deformation of the flexible sheet on the outer side with respect to a location at which the flexible sheet is secured to the magnetic member.

In the present invention, the flexible sheet may include a sensor that detects contact. Since the flexible sheet includes a sensor that detects contact, the sensor can be utilized as a highly sensitive touch sensor.

In the present invention, the back plate may include a sensor that detects contact. Since the back plate includes a sensor that detects contact, the sensor can be protected by the flexible sheet, the magnetic member, and the gel, and the sensor can be utilized as a highly durable touch sensor. In an aspect in which both the flexible sheet and the back plate include respective sensors, two-stage detection is enabled by adjusting their thresholds.

In the present invention, the sensor may be a capacitive sensor, and the gel may be a conductive gel. Since the sensor is a capacitive sensor and the gel is a conductive gel, variations in capacitance can be transmitted easily through the gel to enhance the sensitivity of the sensor in the magnetic deformable member in which the back plate includes the capacitive sensor.

In the present invention, the sensor may be a capacitive sensor, and the magnetic member may be a conductive gel. Since the sensor is a capacitive sensor and the magnetic member is a conductive gel, variations in capacitance can be transmitted easily through the magnetic member to enhance the sensitivity of the sensor in the magnetic deformable member in which the back plate includes the capacitive sensor.

In the present invention, the flexible sheet may be a conductive sheet, and the sensor may be electrically insulated from the conductive gel. Since the flexible sheet is a conductive sheet and the sensor is electrically insulated from the conductive gel, variations in capacitance can be transmitted directly to the vicinity of the sensor through the flexible sheet and the conductive gel when the flexible sheet is touched. Thus, the sensitivity of the sensor can be enhanced regardless of the thickness of the magnetic deformable member.

In the present invention, the flexible sheet may be an insulating layer, and the sensor may be electrically connected to the conductive gel. Since the flexible sheet is an insulating layer and the sensor is electrically connected to the conductive gel, the conductivity of the sensor can be extended to the back surface of the flexible sheet through the conductive gel. Thus, the sensitivity of the sensor can be enhanced regardless of the thickness of the gel.

In the present invention, the magnetic deformable member may further include an outer wall provided on an outer side of the magnetic member to connect the flexible sheet and the back plate to each other, the outer wall having a frame shape and being formed from a hard material. Since the magnetic deformable member further includes an outer wall provided on an outer side of the magnetic member to connect the flexible sheet and the back plate to each other, the outer wall having a frame shape and being formed from a hard material, swelling of the gel toward the lateral sides can be suppressed when a stress is applied to the gel through deformation of the magnetic member when a magnetic field is applied. That is, the gel is restrained by the outer wall on the lateral sides and by the back plate on the lower side, and therefore a stress applied to the gel can be efficiently directed toward the flexible sheet to make a projected portion formed on the flexible sheet larger.

In the present invention, a reinforcing layer may be provided on a back surface side of the flexible sheet. In the case of a configuration with no reinforcing layer, there is a clear difference in hardness between a gel placement portion of the flexible sheet, on the back surface side of which the gel is positioned, and a magnetic member placement portion of the flexible sheet, on the back surface side of which the magnetic member is positioned, and there may be a difference in hand feel of the flexible sheet between the gel placement portion and the magnetic member placement portion. With the present invention, in contrast, the magnetic deformable member has the reinforcing layer, and thus the difference in hardness between the gel and the magnetic member is not easily detectable over the flexible sheet which is provided via the reinforcing layer. Hence, with the present invention, the magnetic deformable member can be provided with a sense of uniformity that does not allow one to distinguish the boundary between the magnetic member and the gel when the front surface of the flexible sheet is touched.

With the present invention, further, when the volume of the space occupied by the gel is varied with the magnetic member and the flexible sheet moved by the application of an external magnetic force, the gel generates a stress that presses the reinforcing layer and the flexible sheet. When the reinforcing layer is pushed up from the back surface side of the flexible sheet, clear projections and depressions are formed on the front surface of the flexible sheet. Hence, with the magnetic deformable member according to the present invention, the flexible sheet can be provided with a hand feel with a distinct resistance compared to a configuration in which the gel is directly charged inside the flexible sheet.

In the present invention, a tactile feel presenting member with a tactile feel that is variable in accordance with magnetic field orientation applied by the magnetic member may be provided on a back surface side of the flexible sheet. When the magnetic deformable member has the tactile feel presenting member, a hand feel with a distinct resistance can be provided, as necessary, at a desired location of the flexible sheet.

Further, the present invention provides a magnetic deformable member including: a container body that has a deformable flexible film; a gel charged in the container body; and a magnetic member held on a back surface side of the flexible film inside the container body, in which the flexible film is displaceable together with the magnetic member which is moved by an external magnetic force, and has a deformable front surface.

With the present invention, when the volume of the container body is varied with the magnetic member and the flexible film moved by the application of an external magnetic force, the gel generates a stress that presses the flexible film which is a soft portion of the container body. Consequently, the shape of the front surface of the flexible film is varied. Hence, according to the present invention, the magnetic deformable member can be provided with a front surface shape that is variable in accordance with the application of a magnetic field (external magnetic force).

In the present invention, the container body may include a flexible sheet that serves as the flexible film, and a support member disposed to face the flexible sheet to support the flexible sheet. With the present invention, the front surface shape of the flexible sheet can be varied by attracting the magnetic member in the direction of the support member using an external magnetic force.

Advantages

With the magnetic deformable member according to the present invention, the front surface with a soft tactile feel can be projected by applying a magnetic field.

DESCRIPTION OF THE PREFERRED EMBODIMENTS

"Magnetic deformable members" according to the present invention will be described in detail on the basis of embodiments. The material, size, manufacturing method, effect, function, etc. that are the same among the embodiments will not be described repeatedly.

First Embodiment: [FIGS. 1 to 4]

A "magnetic deformable member" according to the present invention includes a "container body" that has a deformable "flexible film", a gel charged in the "container body", and a magnetic member held on the back surface side of the "flexible film" inside the "container body". The "flexible film" according to the present invention is characterized in being displaceable together with the magnetic member by attracting the magnetic member in the direction away from the "flexible film" using an external magnetic force, and in having a deformable "front surface (front surface shape)". The entirety of the "container body" can be constituted by a single member, i.e. the "flexible film", for example. Alternatively, the "container body" may be constituted by the "flexible film" and a different member, e.g. a "support member". The "flexible film" can be constituted by a flexible sheet 11 to be discussed later, by way of example. The "container body" can be constituted by the flexible sheet 11 and a back plate 12 disposed to face the flexible sheet 11, by way of example.

Figure 2:
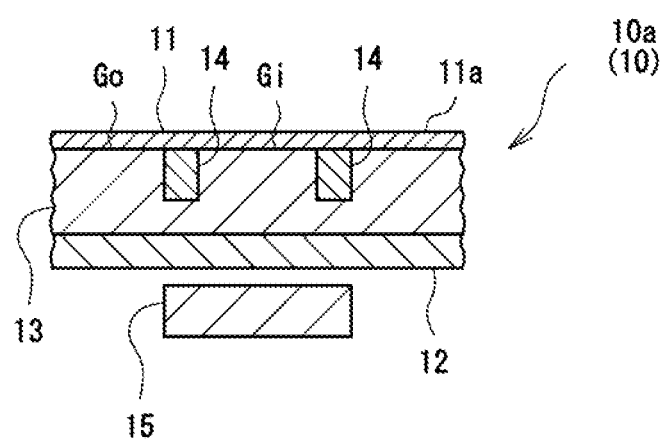
FIG. 2 is a sectional view taken along the line II-II in FIG. 1.
Figure 3:
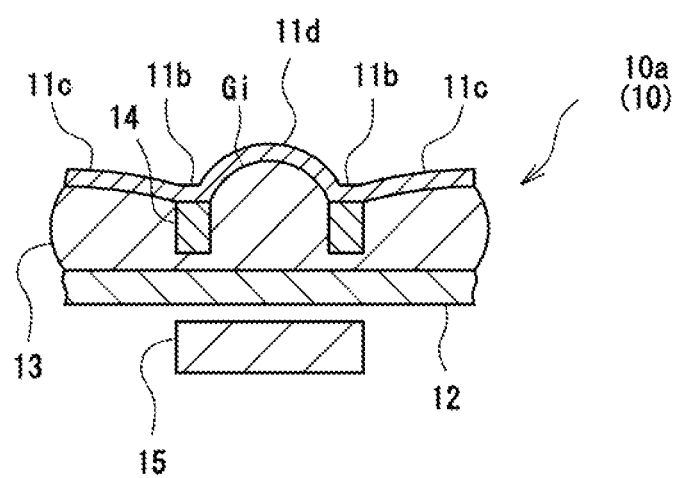
FIG. 3 is a sectional view, corresponding to FIG. 2, of the magnetic deformable member according to the first embodiment with application of a magnetic field.

The following three types of magnetic deformable members 10a, 10b, and 10c will be described sequentially as a magnetic deformable member 10 according to a first embodiment. First, as illustrated in the plan view in FIG. 1 and the sectional view in FIG. 2, the magnetic deformable member 10a includes, as the "container body", a flexible sheet 11 that serves as the "flexible film" and a back plate 12. A gel 13 is charged inside a space between the flexible sheet 11 and the back plate 12 which is made of a hard material and disposed to face the flexible sheet 11. A magnetic member 14 having an annular shape as viewed in plan in a direction that is perpendicular to a front surface 11a of the flexible sheet 11 and having a length in the perpendicular direction is provided on the back surface side of the flexible sheet 11. The magnetic member 14 is secured to the flexible sheet 11, and disposed in the gel 13 as spaced from the back plate 12. A magnet 15 that serves as the "magnetic force generation member" is provided on the outer side of the back plate 12. When a magnetic field is applied to the magnetic deformable member 10a by the magnet 15, as illustrated in FIG. 3, a surrounded portion 11d on the inner side of a boundary portion 11b, at which the magnetic member 14 is secured to the flexible sheet 11, rises with respect to the boundary portion 11b and a surrounding portion 11c on the outer side of the boundary portion 11b to form a projected portion. Such portions that constitute the magnetic deformable member 10a will be described in detail below.

The magnetic member 14 which has an annular outer shape is made of a material that is attracted by the magnet 15 when a magnetic field is generated by the magnet 15, has an annular shape as viewed in plan in a direction that is perpendicular to the front surface of the flexible sheet, and is formed in a circular column shape to extend in the perpendicular direction.

It is only necessary that the magnetic member 14 should be a ferromagnetic material. The magnetic member 14 may be ferromagnetic metal or a metal oxide itself, for example, and may be a gel-like member obtained by dispersing ferromagnetic powder in a binder. The magnetic member 14 may be a hard material, but is preferably a deformable gel-like member. A first reason is that, if the magnetic member 14 is a hard material, the front surface 11a of the flexible sheet 11 tends to be stepped at a portion at which the magnetic member 14 is secured to the flexible sheet 11, which may degrade the appearance and provide a partially hard tactile feel. A second reason is that, while the magnetic member 14 is displaced, or displaced and deformed, in a magnetic field, the magnetic member 14 is displaceable but not easily deformable in the case where the magnetic member 14 is made of a hard material. If the magnetic member 14 is made of a gel-like member, on the other hand, the magnetic member 14 is not only displaceable but also easily deformable. If a small magnet is used as the magnet 15, for example, the magnetic member 14 is attracted in the direction of reducing the diameter of the annular shape to be deformed. As a result of such deformation, the flexible sheet 11 can be projected more distinctively.

If the magnetic member 14 is rigid, on the other hand, the magnetic force of the magnetic member 14 can be enhanced compared to that of a magnetic member 14 obtained by dispersing ferromagnetic powder in a binder. Thus, in order to provide the gel 13 with an equivalent stress and form an equivalent projected portion on the front surface 11a of the flexible sheet 11, the hard magnetic member 14 can be a magnet that is smaller than the magnetic member 14 which is a soft elastic material.

Specific examples of the ferromagnetic material include metal soft magnetic materials such as iron, nickel, and cobalt, soft magnetic alloys such as iron-silicon alloy, permalloy, sendust, and permendur, and magnetic powder such as soft ferrite. The binder is made of a high-polymer material. Examples of the binder include a high-polymer gel, rubber, and a thermoplastic elastomer which are highly flexible. Examples of the high-polymer gel include a silicone gel and a polyurethane gel. Examples of the rubber include natural rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorocarbon rubber, urethane rubber, silicone rubber, polyisobutylene rubber, and acrylic rubber. Examples of the thermoplastic elastomer include a styrene thermoplastic elastomer, an olefin thermoplastic elastomer, a polyester thermoplastic elastomer, and a polyurethane thermoplastic elastomer. Among these, use of a silicone gel which can be highly filled with magnetic bodies and which can be hardened to form a flexible gel is preferable. Such high-polymer materials may be used in combination of two or more kinds thereof, rather than being used singly.

In the case where a ferromagnetic material is dispersed in a binder, the magnetic member may contain a variety of additives that do not impair the function thereof, besides the magnetic material and the binder. For example, the magnetic member may contain an organic component such as a plasticizer, a disperser, a coupling agent, and a tackiness agent. In addition, other components such as a fire retardant, an antioxidant, and a coloring agent may also be added as appropriate.

The length of the magnetic member 14 in the vertical direction (length thereof in the depth direction as viewed in plan) can be 95% or less, preferably 85% or less, of the thickness of the gel 13 which corresponds to the spacing between the flexible sheet 11 and the back plate 12. When the length of the magnetic member 14 is more than 85%, the volume of the gel 13 which is positioned under the magnetic member 14 to be compressed by the magnetic member 14 is reduced, and a large swell may not be formed. When the length of the magnetic member 14 is more than 95%, there is a high possibility of occurrence of such a phenomenon. On the other hand, the lower limit of the length of the magnetic member 14 in the vertical direction is preferably 0.5 mm or more in the case where the magnetic member 14 is a gel-like member obtained by dispersing ferromagnetic powder in a binder. When the lower limit is less than 0.5 mm, the magnet 15 and the magnetic member 14 do not attract each other with a strong force, and there may not be a stress that is enough to form a large swell (projected portion) in the surrounded portion 11$d$. In the case where the magnetic member 14 is formed from a hard material such as a ferromagnetic material, meanwhile, the length of the magnetic member 14 in the vertical direction is preferably 0.1 mm or more. This is because the magnetic member 14 with a length of about 0.1 mm can generate a stress for forming a swell (projected portion) in the surrounded portion 11$d$ in the case where a ferromagnetic material itself is used, compared to a case where the magnetic member 14 is obtained by dispersing ferromagnetic powder in a binder.

Figure 4:
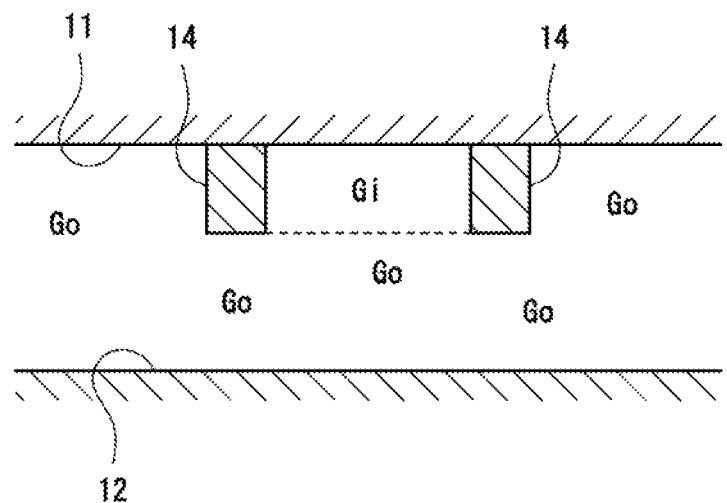
FIG. 4 illustrates the positional relationship between an inner gel and an outer gel in the magnetic deformable member according to the first embodiment.

Subsequently, the gel 13 will be described. The gel 13 is a member that occupies most of the space inside the magnetic deformable member 10$a$, and that provides the magnetic deformable member 10$a$ with a soft tactile feel. More specifically, the flexible sheet 11 is stacked on one side of the gel 13, and the back plate 12 is stacked on the other side thereof. In addition, the magnetic member 14 is disposed inside the stacked body. As illustrated in FIG. 4, the gel 13 which is located inside the annular magnetic member 14 is referred to as an inner gel Gi, and the remaining portion of the gel 13 is referred to as an outer gel Go. The gel 13 may be constituted of a single member as a whole, and may be constituted by combining different members for the inner gel Gi and the outer gel Go.

Examples of the material of the gel 13 include a high-polymer gel, rubber, and a thermoplastic elastomer which are highly flexible. Examples of the high-polymer gel include a silicone gel and a polyurethane gel. Examples of the rubber include natural rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorocarbon rubber, urethane rubber, silicone rubber, polyisobutylene rubber, and acrylic rubber. Examples of the thermoplastic elastomer include a styrene thermoplastic elastomer, an olefin thermoplastic elastomer, a polyester thermoplastic elastomer, and a polyurethane thermoplastic elastomer. Among these, use of a silicone gel which can form a significantly flexible gel is preferable. Such high-polymer materials may be used in combination of two or more kinds thereof, rather than being used singly.

The material of the gel 13 preferably has a hardness value of 50 or less, the hardness value (hereinafter "E hardness") being measured by a hardness meter of the type E of Japan Industrial Standard (JIS) K 6253. When the hardness is more than E50, variations in shape upon application of a magnetic field may be small. The lower limit of the E hardness is not defined, because values that are the measurement limit or less (E0 or less) are also included in the preferable range. When the values that are E0 or less are evaluated using a penetration number which is another scale, penetration numbers in the range from about 100 to 320 are preferably used, and penetration numbers of up to 340 can be used. When the gel 13 is softer with a penetration number of more than 340, the magnetic deformable member 10$a$ may be deformed by its own weight and may not maintain its shape. The penetration number is obtained as a result of measuring the penetration number for a front surface of a test piece using a device described in JIS K 2220 under the following test conditions. That is, a needle in the shape prescribed in JIS K 2207 is used, and the total weight of the needle and a needle fixing device (i.e. the weight on the test piece) is 50 g.

The hardness of the gel 13 may be the same as or different from the hardness of the magnetic member 14. If the hardness of the gel 13 and the hardness of the magnetic member 14 are the same as each other, an integral magnetic deformable member 10$a$ in which the difference in hardness between the magnetic member 14 and the gel 13 is not felt and the boundary therebetween is not distinct when a magnetic field is not applied can be obtained. When a magnetic field is applied, on the other hand, a certain degree of flexibility can be exhibited, because the outer gel Go is stacked under the magnetic member 14 and the outer gel Go which lies under the magnetic member 14 is deformable even in the case where the magnetic member 14 is hard. In that sense, the magnetic member 14 may have a variety of hardnesses, and the gel 13 is particularly preferably a flexible material.

The gel 13 is preferably not magnetized at all in a magnetic field. However, a gel containing such a small amount of a magnetic filler that does not significantly increase the magnetism of the gel is not excluded, and it is only necessary that the gel should be substantially non-magnetic by being less magnetized than the magnetic member 14.

The flexible sheet 11 is a member with one surface exposed to the outside to serve as the front surface 11$a$ of the magnetic deformable member 10$a$. The exposed front surface 11$a$ also serves as a contact surface to be touched by humans, and also serves as a surface on which a projected portion is to be formed by the effect of a magnetic field. Meanwhile, the other surface faces the inner side of the magnetic deformable member 10$a$, and is in contact with the magnetic member 14, the inner gel Gi, and the outer gel Go.

The shape of the flexible sheet 11 is not limited. However, the flexible sheet 11 is preferably in the shape of a relatively thin sheet. Specifically, the flexible sheet 11 is preferably a resin sheet with a thickness of about 10 to 1000 μm. In the case where the flexible sheet 11 has a thickness of less than 10 μm, there may be a concern about the durability of the flexible sheet 11 as a contact surface. In the case where the flexible sheet 11 has a thickness of more than 1000 μm, meanwhile, the flexible sheet 11 may not be so easily deformable as to facilitate formation of a projected portion. In the case where the flexible sheet 11 is easily deformable in spite of having a thickness of more than 1000 μm, there is a concern about the durability of the flexible sheet 11 due to the excessive flexibility of the material thereof.

Such a flexible sheet 11 is preferably made of a material that has both a certain degree of flexibility and durability. Specific examples of the material include rubber and a thermoplastic elastomer. Examples of the rubber include natural rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorocarbon rubber, urethane rubber, silicone rubber, polyisobutylene rubber, and acrylic rubber. Examples of the thermoplastic elastomer include a styrene thermoplastic elastomer, an olefin thermoplastic elastomer, a polyester thermoplastic elastomer, and a polyurethane thermoplastic elastomer. Among these, use of butyl rubber, urethane rubber, and a polyurethane thermoplastic elastomer which are flexible and highly durable is preferable. Such high-polymer materials may be used in combination of two or more kinds thereof, rather than being used singly.

The back plate 12 is a member that serves as the core of the magnetic deformable member 10a, and has a role of keeping the magnetic deformable member 10a in shape. The back plate 12 is also a member disposed between the magnet 15 and the magnetic member 14 to suppress downward deformation of the gel 13 due to the effect of the magnetic member 14. Therefore, the back plate 12 is preferably made of a rigid material. Examples of the material include rubber, a thermoplastic elastomer, a thermoplastic resin, a thermosetting resin, and inorganic materials such as metals and ceramics which are harder than the gel 13 and flexible sheet 11. Among such materials, however, use of a magnetic material which adversely affects the magnetism of the magnet 15 is restricted. Specifically, if a magnetic material is used all over the back plate 12, the magnetic material serves as a magnetic shield that significantly weakens, or totally eliminates, the effect of the magnet 15 on the magnetic member 14. Therefore, a magnetic material cannot be used all over the back plate 12. In order to avoid local concentration of a magnetic field in the back plate 12, on the other hand, a magnetic material can be used partially at a position under the center of the magnetic member 14 at which a projected portion is to be formed, for example.

The magnet 15 which serves as the "magnetic force generation member" is disposed on the outer side of the back plate 12. The magnet 15 may be integrated as one element of the magnetic deformable member 10a, or may be provided separately. In the case where the magnetic deformable member 10a is not provided with the magnet 15, a device to which the magnetic deformable member 10a is to be attached can be provided with the magnet 15 to achieve a similar function. The magnet 15 can be a permanent magnet, or can be an electromagnet in which a coil is used. In the case where an electromagnet is used, the magnetic force can be controlled by turning of and off a current, and therefore the magnet 15 can be fixed to the back surface of the back plate 12. In the case where a permanent magnet is used, meanwhile, the magnetic field may be controlled by moving the magnet 15, or by providing a yoke that serves as a magnetic path between the magnet 15 and the back plate 12 and moving the yoke.

The outer dimensions of the magnet 15 are not limited, and the magnet 15 may be generally as large in outer dimensions as the magnetic member 14 as viewed in plan. In the case of such a configuration, the magnetic member 14 is attracted perpendicularly toward the magnet 15. Thus, a swell (projected portion) is formed in the surrounded portion 11d of the flexible sheet 11 with the inner gel Gi receiving a stress mainly because of deformation of the gel 13 which is positioned under the magnetic member 14.

The various members which constitute the magnetic deformable member 11a may be of a desired size. By way of example, the following aspect can be adopted. The magnetic member 14 can have a circular column shape with an inside diameter of 10 mm, an outside diameter of 16 mm, and a length (height) of 2 mm. This is because variations in tactile feel can be easily felt during an operation with a finger if the inside diameter of the magnetic member 14 is about the same size as a fingertip. The gel 13 which surrounds the magnetic member 14 can have a thickness of 3 mm, which corresponds to the spacing between the flexible sheet 11 and the back plate 12, in the direction of the length of the magnetic deformable member 11a (direction that is perpendicular to the front surface 11a of the flexible sheet 11), and have a circumferential length of 30 mm. The flexible sheet 11 can have a thickness of 300 µm and a circumferential length of 40 mm. The back plate 12 can have a thickness of 1 mm and a circumferential length of 40 mm.

Subsequently, the effect achieved when a magnetic field is applied to the magnetic deformable member 10a will be described. Again with reference to FIGS. 2 and 3, FIG. 2 illustrates a state in which an electromagnet is used for the magnet 15 and a magnetic field is not applied, and FIG. 3 illustrates a state in which a magnetic field is applied. When a magnetic field is not applied, as illustrated in FIG. 2, the front surface 11a of the magnetic deformable member 10a is a flat surface. When a magnetic field is applied, the front surface 11a is deformed as illustrated in FIG. 3. Such variations in structure will be described more specifically. When a magnetic field is applied, the magnetic member 14 is attracted by the magnet 15, and the magnetic member 14 is displaced toward the back plate 12 (downward). In this event, the inner gel Gi inside the magnetic member 14 and the outer gel Go outside the magnetic member 14 are subjected to a shearing stress. On the other hand, the outer gel Go which is located under the annular magnetic member 14 is subjected to a compressive stress. Because of such stresses, the inner gel Gi is considered to generate a stress in the direction of pressing the back plate 12 around the center. Since the back plate 12 is not easily deformable, however, the stress cannot be relieved downward. On the lateral sides, meanwhile, the magnetic member 14 suppresses relief of the stress. Thus, the stress is released upward, and presses the flexible sheet 11 to form a projected portion on the front surface 11a of the flexible sheet 11. In this event, the boundary portion 11b of the flexible sheet 11 is drawn by the magnetic member 14 and not deformable upward, and therefore a swell in which the surrounded portion 11d is projected significantly is formed.

On the other hand, the surrounding portion 11c on the outer side of the boundary portion 11b is projected slightly because of the stress of the outer gel Go. At the outer periphery of the magnetic member 14, however, the stress can also be relieved in the lateral direction, and therefore the surrounding portion 11c is projected slightly, which relatively distinguishes the projected portion which is formed at the center. The thus formed projected portion of the magnetic deformable member 10a contains the gel 13 inside, and therefore maintains a soft tactile feel even with the front surface 11a projected significantly. In addition, a projected portion that projects upward in a direction opposite to the direction in which the magnet 15 is located can be formed while disposing the magnet 15 under the projected portion.

The formation of such a swell is affected by the length of the magnetic member 14 and the spacing between the flexible sheet 11 and the back plate 12, and the magnetic member 14 receives a larger force from a magnetic field as the magnetic member 14 is longer. When the magnetic member 14 is excessively long, on the other hand, the magnetic member 14 abuts against the back plate 12, and the magnetic member 14 is not easily displaceable even if the magnetic member 14 is soft.

Figure 5:
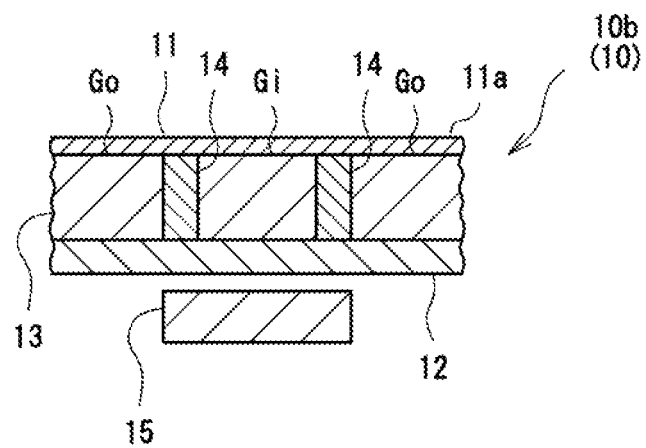
FIG. 5 is a sectional view, corresponding to FIG. 2, of a magnetic deformable member according to a first modification of the first embodiment.

First Modification of First Embodiment: [FIG. 5]

The magnetic deformable member 10b according to the present embodiment is different from the magnetic deformable member 10a described in relation to the preceding embodiment in that, as illustrated in the sectional view in FIG. 5, the magnetic member 14 is in contact with the back plate 12 and there is no spacing between the magnetic member 14 and the back plate 12. In the magnetic deformable member 10b, in addition, it is necessary that the magnetic member 14 should be flexible and soft enough to be deformable when a magnetic field is applied.

Since the magnetic member 14 is a deformable elastic member, the magnetic member 14 is compressed when a magnetic field is applied to the magnetic member 14. With the magnetic member 14 disposed in contact with the back plate 12, in addition, it can be made difficult for the gel 13 which is located in the annular magnetic member 14 to flow out of the annular shape, which makes it easy for the stress of the gel 13 in the annular shape to be compressed to act on the front surface 11a of the flexible sheet 11.

Figure 6:
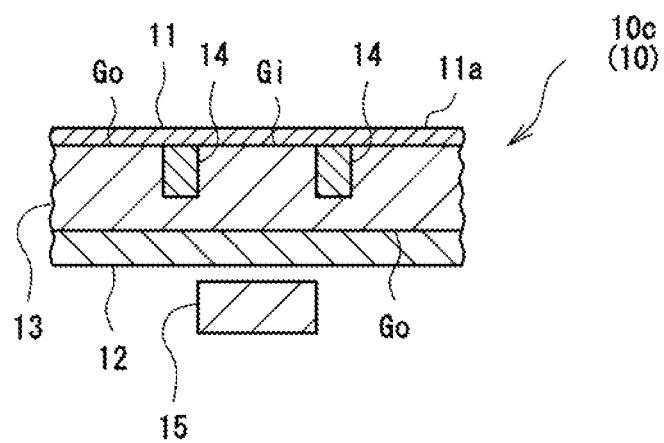
FIG. 6 is a sectional view, corresponding to FIG. 2, of a magnetic deformable member according to a second modification of the first embodiment.
Figure 7:
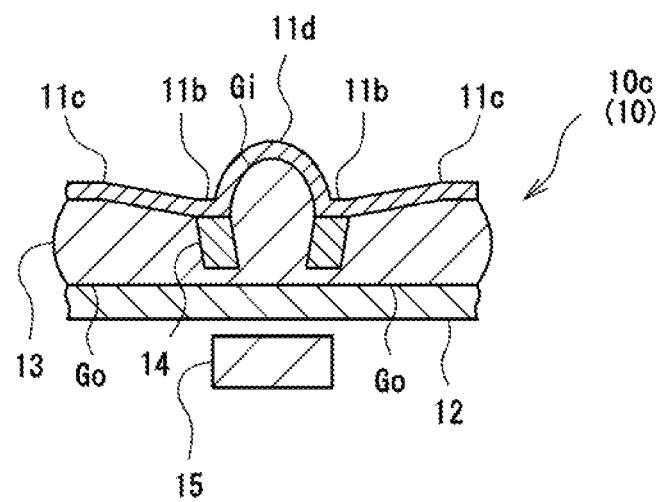
FIG. 7 is a sectional view, corresponding to FIG. 2, of the magnetic deformable member according to the second modification of the first embodiment with application of a magnetic field.

Second Modification of First Embodiment: [FIGS. 6 and 7]

In the magnetic deformable member 10c according to the present embodiment, as illustrated in the sectional view in FIG. 6, the magnet 15 has a different size, and is smaller in outer dimensions than and analogous in shape to the magnetic member 14 as viewed in plan. In the magnetic deformable member 10c, when a magnetic field is applied, as illustrated in FIG. 7, the magnetic member 14 is attracted perpendicularly toward the magnet 15, and also attracted inward in the diameter reducing direction. Thus, a stress that directly compresses the inner gel Gi which is located inside the annular magnetic member 14 is generated in addition to deformation of the gel 13 which is positioned under the magnetic member 14, as a result of which a large projected portion is formed in the surrounded portion 11d and projection in the surrounding portion 11c is suppressed. Thus, projection in the surrounded portion 11d is distinguished, which allows significant visual variations to be made by turning on and off a magnetic field applied to the magnetic deformable member 10c.

Figure 8:
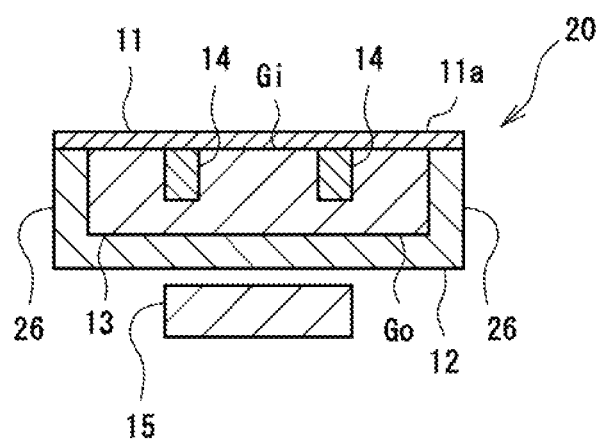
FIG. 8 is a sectional view, corresponding to FIG. 2, of a magnetic deformable member according to a second embodiment.
Figure 9:
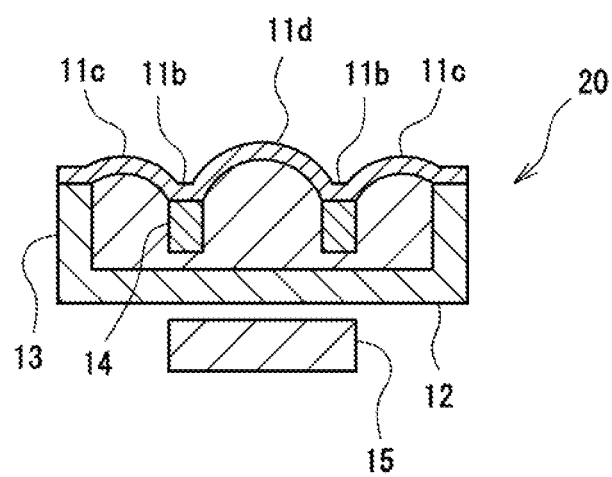
FIG. 9 is a sectional view, corresponding to FIG. 2, of the magnetic deformable member according to the second embodiment with application of a magnetic field.

Second Embodiment: [FIGS. 8 and 9]

As illustrated in the sectional view in FIG. 8, a magnetic deformable member 20 according to the present embodiment has an outer wall 26 at the outer periphery. The magnetic deformable member 20 is otherwise the same in configuration as the magnetic deformable member 10a according to the first embodiment.

The outer wall 26 can be the same in material as the back plate 12. The outer wall 26 may be integrated with the back plate 12 to extend upright from the outer periphery thereof, or may be a member that is separate from the back plate 12. By providing such an outer wall 26, deformation of the outer gel Go toward the lateral surfaces can be suppressed when a magnetic field is applied to the magnetic deformable member 20. In this manner, a stress received by the outer gel Go can be directed upward, and a stress released from the inner gel Gi to the outer gel Go can be relieved. Thus, all the stresses can be directed upward, which can make a swell that appears on the front surface 11a of the flexible sheet 11 larger as illustrated in FIG. 9.

By providing the outer wall 26, in addition, an enclosed space in which the gel 13 is completely sealed can be formed by the flexible sheet 11, the back plate 12, and the outer wall 26. The gel 13 has relatively weak physical properties, and therefore the durability of the magnetic deformable member 20 can be enhanced by retaining the gel 13 in an enclosed space.

Also in the magnetic deformable member 20 according to the present embodiment, as in the magnetic deformable member 10 according to the first embodiment, the magnetic member 14 may be in contact with the back plate 12, or the magnet 15 may be smaller in outer dimensions than the magnetic member 14 as viewed in plan.

Figure 10:
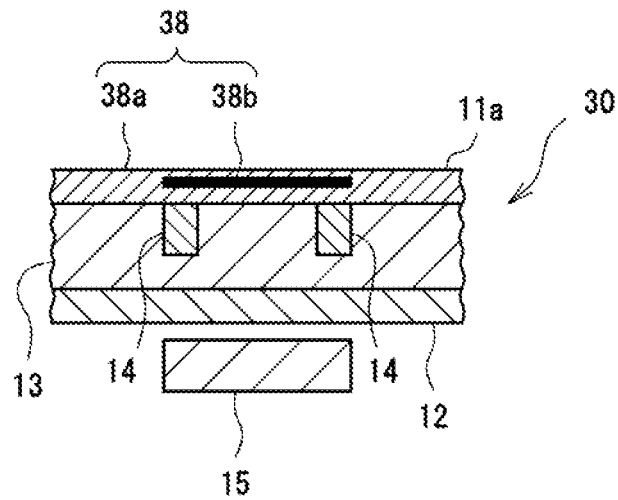
FIG. 10 is a sectional view, corresponding to FIG. 2, of a magnetic deformable member according to a third embodiment.

Third Embodiment: [FIG. 10]

Each of the magnetic deformable members described in relation to the above embodiments can be provided with a sensor that detects contact or a pressure. A magnetic deformable member 30 described in relation to the third embodiment includes a flexible sheet 38 in which a sensor 38b is provided in a flexible base sheet 38a, in place of the flexible sheet 11 which is used in the magnetic deformable members described so far. The sensor 38b is connected to a control integrated circuit (IC) or the like through a wire (not illustrated).

The sensor 38b may be any sensor that does not impair the function of forming a swell in the surrounded portion 11d when a magnetic field is applied. In other words, a sensor that is flexible enough not to hinder a swell in the surrounded portion 11d can be used. Examples of such a sensor 38b include an expandable sensor that includes an electrode formed from an elastic conductive material and a sensor that is made expandable as a whole by combining a low-expansion portion and a high-expansion portion. Examples of the type of the sensor include a pressure-sensitive sensor and a capacitive sensor. The flexible base sheet 38a may be made of a material described for the flexible sheet 11 in relation to the first embodiment.

The magnetic deformable member 30 in which the flexible sheet 38 includes the sensor 38b can have an enhanced sensor sensitivity compared to a magnetic deformable member 40 in which a sensor 48b is provided in a back plate 12 to be discussed later. Thus, the magnetic deformable member 30 can be utilized as a highly sensitive touch sensor.

The sensor 38b may be provided on the front surface 11a of the flexible sheet 11 described in relation to the preceding embodiments, rather than being provided in the flexible sheet 38, and may be covered by providing a flexible protection layer 48a on top of the sensor 38b. The sensor 38b is connected to a control IC or the like through a wire (not illustrated).

Figure 11:
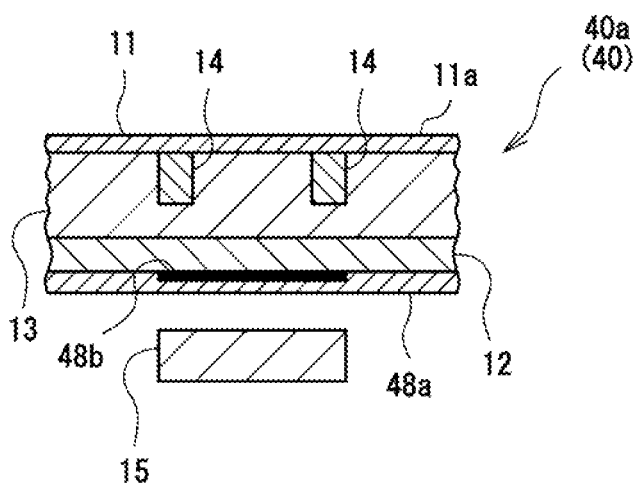
FIG. 11 is a sectional view, corresponding to FIG. 2, of a magnetic deformable member according to a fourth embodiment.

Fourth Embodiment: [FIG. 11]

The following two types of magnetic deformable members 40a and 40b will be described sequentially as a magnetic deformable member 40 according to a fourth embodiment. First, in the magnetic deformable member 40a, as illustrated in the sectional view in FIG. 11, a sensor 48b is provided on the magnet 15 side (lower side) of the back plate 12 which is used in the magnetic deformable members described so far. A protection layer 48a is provided on the surface of the back plate 12 on which the sensor 48b is provided. The sensor 48b is connected to a control IC or the like through a wire (not illustrated). The sensor 48b may be a sensor that does not impair the function of the back plate 12. However, the sensor 48b is not particularly required to be flexible, unlike the sensor 38b described in relation to the third embodiment, and a variety of pressure-sensitive sensors and capacitive sensors may be used.

In the magnetic deformable member 40a, at least one of the magnetic member 14 and the inner gel G is preferably conductive. If the spacing between the flexible sheet 11 and the back plate 12 is widened to thicken the gel 13, the distance between the front surface 11a of the flexible sheet 11 and the sensor 48b is increased, and there is a concern that the sensitivity of the capacitive sensor may be degraded. However, the degradation in sensitivity can be suppressed by providing such components with conductivity. With focus on the distance between the lowermost portion of the magnetic member 14 or the gel 13 and the sensor 48b and the area of overlap between the magnetic member 14 or the gel 13 and the sensor 48b, it is more preferable that the gel 13 is conductive.

A magnetic conductive gel can be used in order to provide the magnetic member 14 with conductivity. A conductive gel that is not ferromagnetic can be used in order to provide the inner gel Gi with conductivity. The entire gel 13 including the outer gel Go may be conductive. Such a conductive gel can be obtained by adding a conductive filler such as carbon and metal particles to a non-conductive binder or using a conductive polymer. Use of a fibrous conductor as the conductive filler is preferable, because the binder can be provided with conductivity without significantly impairing the flexibility of the binder. The conductivity is preferably a volume resistivity of 100 Ω~cm or less.

In the magnetic deformable member 40a, the flexible sheet 11 is also preferably made of a conductive material ("conductive sheet"). This is because there is a concern that the sensitivity of a capacitive sensor may be degraded as the flexible sheet 11 is thicker and such a degradation in sensitivity can be suppressed if the flexible sheet 11 is conductive. Examples of the conductive flexible sheet 11 include a resin film with conductive layers formed on the front and back sides thereof and electrically continuous with each other via a through hole, and a conductive film made of a resin to which a conductive filler has been added.

The magnetic deformable member 40 in which the back plate 12 includes the sensor 48b can be free from a concern about deformation or wear of the sensor compared to the magnetic deformable member 30 in which the flexible sheet 38 includes the sensor 38b. Thus, the magnetic deformable member 40 can be highly durable.

In the case where a capacitive sensor is adopted, by forming the flexible sheet 11 and at least one of the magnetic member 14 and the gel 13 to be conductive, variations in capacitance between the front and back surfaces of the back plate 12 can be detected when the front surface 11a of the flexible sheet 11 is touched, since the front surface 11a of the flexible sheet 11 and the front surface of the back plate 12 are electrically continuous with each other. Thus, the sensor is not easily affected by the thickness of the flexible sheet 11 or the gel 13, and a degradation in sensitivity of the sensor can be suppressed even in the case where such components are thick.

Figure 12:
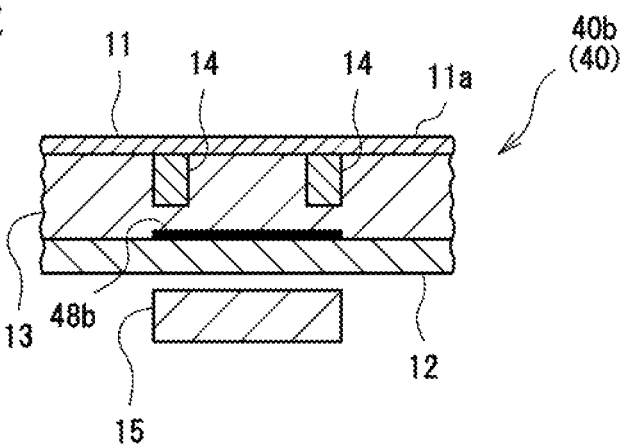
FIG. 12 is a sectional view, corresponding to FIG. 2, of a magnetic deformable member according to a first modification of the fourth embodiment.

First Modification of Fourth Embodiment: [FIG. 12]

In the magnetic deformable member 40b according to the present embodiment, as illustrated in the sectional view in FIG. 12, the sensor 48b is provided on the gel 13 side (upper side) of the back plate 12, which is different from the magnetic deformable member 40a in which the sensor 48b is provided on the magnet 15 side (lower side) of the back plate 12.

In the case where a capacitive sensor is adopted, at least one of the magnetic member 14 and the inner gel Gi is preferably formed from a conductive gel, which is the same as the magnetic deformable member 40a. On the other hand, the flexible sheet 11 is an insulating sheet ("insulating layer"). With such a configuration, at least one of the magnetic member 14 and the gel 13 and the sensor 48b are electrically continuous with each other, and therefore variations in capacitance between the front and back surfaces of the flexible sheet 11 can be detected when the front surface 11a of the flexible sheet 11 is touched. Thus, the sensor is not easily affected by the thickness of the gel 13, and a degradation in sensitivity of the sensor can be reduced even in the case where the spacing between the flexible sheet 11 and the back plate 12 is wide and thick. Use of the flexible sheet 11 with a thickness of 300 μm or less hardly adversely affects the sensitivity of the capacitive sensor. Also in the present embodiment, with focus on the distance and the overlap between the uppermost portion of the magnetic member 14 or the gel 13 and a fingertip, the gel 13 is preferably conductive in order to enhance sensitivity when the surrounded portion 11d of the flexible sheet 11 is touched.

Figure 13:
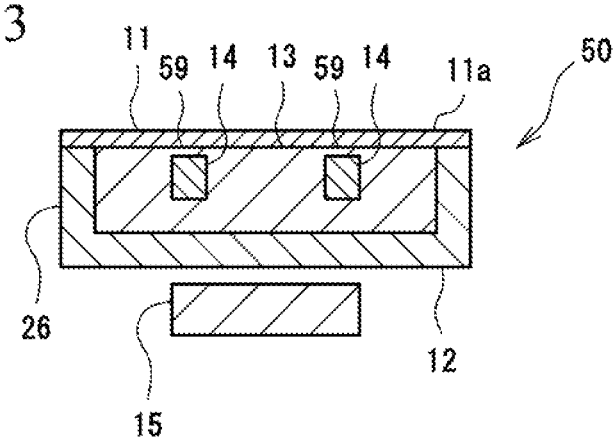
FIG. 13 is a sectional view, corresponding to FIG. 2, of a magnetic deformable member according to a fifth embodiment.
Figure 14:
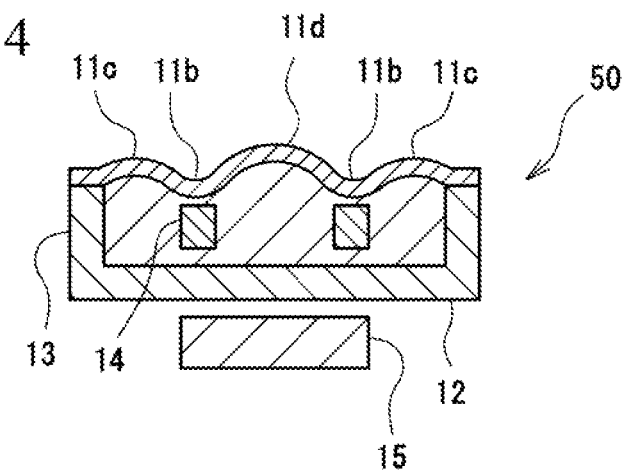
FIG. 14 is a sectional view, corresponding to FIG. 2, of the magnetic deformable member according to the fifth embodiment with application of a magnetic field.

Fifth Embodiment: [FIGS. 13 and 14]

In a magnetic deformable member 50 according to the present embodiment, as illustrated in FIG. 13, the magnetic member 14 and the flexible sheet 11 are not in contact with each other, and a buffer portion 59 filled with the gel 13 is provided therebetween. In each of the embodiments described above, the magnetic member 14 and the flexible sheet 11 are secured to each other, and there is a concern that the shape of the boundary portion 11b at which the flexible sheet 11 is secured to the magnetic member 14 appears on the front surface 11a of the flexible sheet 11. With the buffer portion 59, however, displacement of the boundary portion 11b in the flexible sheet 11 can be relieved to make the boundary portion 11b smooth.

Such variations in structure will be described more specifically. When a magnetic field is applied, the magnetic member 14 is attracted by the magnet 15, and the magnetic member 14 is displaced toward the back plate 12 (downward). In this event, as in the first embodiment, the inner gel Gi inside the magnetic member 14 and the outer gel Go outside the magnetic member 14 are subjected to a shearing stress. In this event, the magnetic member 14 displaces the flexible sheet 11 downward along with displacement of the magnetic member 14. However, intervention of the buffer portion 59 allows the buffer portion 59 to be expanded around the boundary at which a stress particularly concentrates, which makes the boundary portion 11b smooth. If the buffer portion 59 is excessively thick, the buffer portion 59 provides an excessively large buffering force, which does not allow the boundary portion 11b of the flexible sheet 11 to be displaced downward. As a result, a distinguished projected portion cannot be formed. From such a point of view, the length of the buffer portion 59 in the vertical direction (length thereof in the depth direction as viewed in plan) is preferably 1 to 10% of the thickness of the gel 13 which corresponds to the spacing between the flexible sheet 11 and the back plate 12. By applying such a buffer portion 59, the presence of the magnetic member 14 is not apparent when a magnetic field is applied as illustrated in FIG. 14, which provides the magnetic deformable member 50 with a good appearance.

Figure 15:
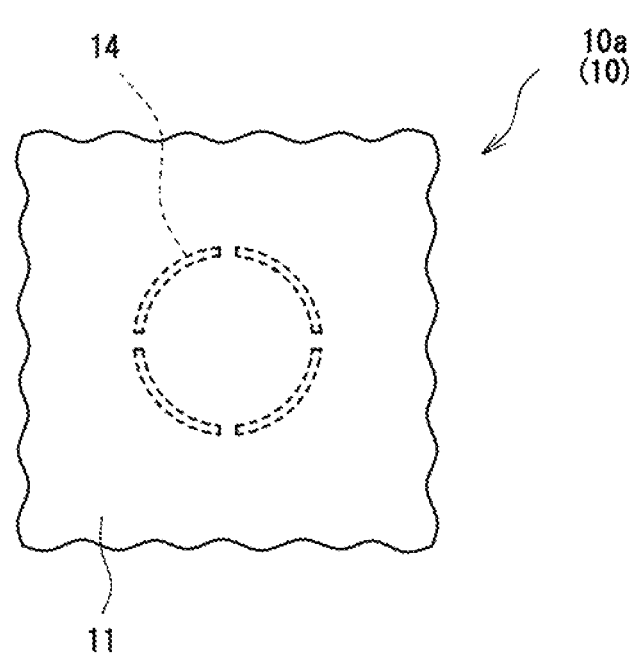
FIG. 15 is a plan view of a magnetic deformable member according to a different modification.

Different Modification: [FIG. 15]

Figure 16:
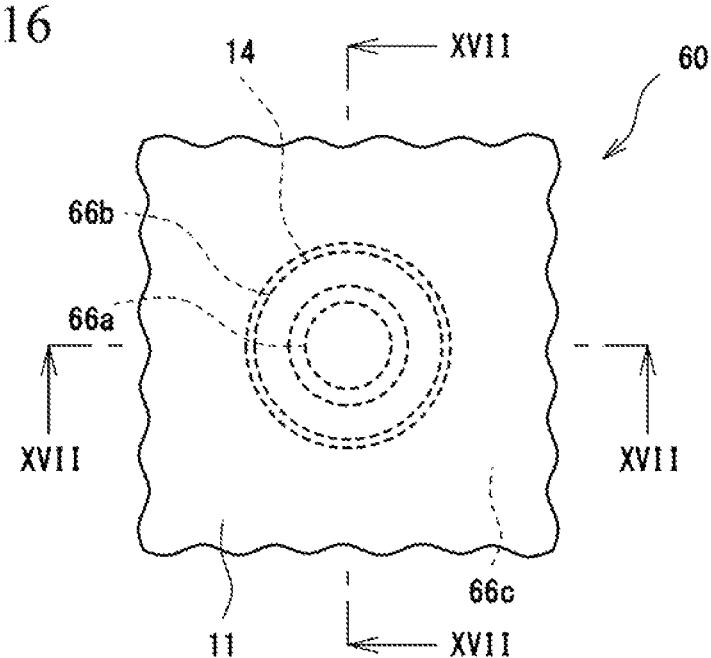
FIG. 16 is a plan view of a magnetic deformable member according to a sixth embodiment.
Figure 17:
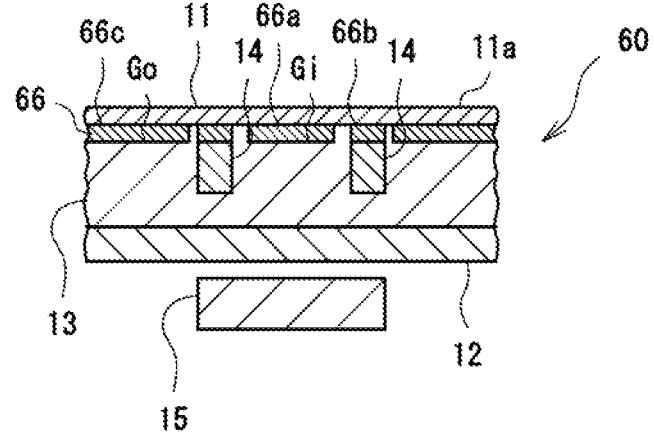
FIG. 17 is a sectional view taken along the line XVII-XVII in FIG. 16.
Figure 18:
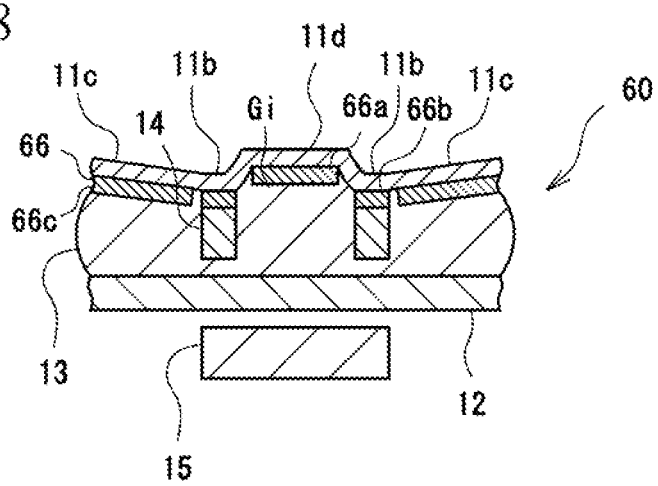
FIG. 18 is a sectional view, corresponding to FIG. 17, of the magnetic deformable member according to the sixth embodiment with application of a magnetic field.

Sixth Embodiment: [FIGS. 16 to 18]

As illustrated in FIGS. 16 and 17, a magnetic deformable member 60 according to the present embodiment has a reinforcing layer 66 on the back surface (inner, lower) side of the flexible sheet 11.

In the case of a configuration with no reinforcing layer 66, there is a difference in ease of deflection caused when the flexible sheet 11 is pressed between a "gel placement portion" of the flexible sheet 11, on the back surface side of which the gel 13 is positioned, and a "magnetic member placement portion" of the flexible sheet 11, on the back surface side of which the magnetic member 14 is positioned. The ease of deflection (difficulty of deflection) is perceived by a user as a tactile feel that indicates the softness (hardness) of an object. Therefore, in the case of a configuration with no reinforcing layer 66, there may be a difference in hand feel of the flexible sheet 11 between the "gel placement portion" and the "magnetic member placement portion".

In the present embodiment, in contrast, the magnetic deformable member 60 has the reinforcing layer 66 which is solid and more rigid than the gel 13 which is fluid, and thus neither of the "gel placement portion" and the "magnetic member placement portion" is easily deflected. Therefore, with the magnetic deformable member 60, the difference in hardness between the gel 13 and the magnetic member 14 is not easily detectable over the flexible sheet 11 which is provided via the reinforcing layer 66. Hence, with the present embodiment, the magnetic deformable member 60 can be provided with a sense of uniformity that does not allow one to distinguish the boundary between the magnetic member 14 and the gel 13 when the front surface 11a of the flexible sheet 11 is touched.

As illustrated in FIGS. 16 and 17, the reinforcing layer 66 according to the present embodiment is divided into an inner member 66a positioned on the inner side of the inner periphery of the annular magnetic member 14, an annular middle member 66b positioned to face the annular magnetic member 14, and an outer member 66c positioned on the outer side of the outer periphery of the magnetic member 14. The inner member 66a has a circular plate shape with an outside diameter that is smaller than the inside diameter of the magnetic member 14. The inner member 66a contacts the inner gel Gi. The middle member 66b is an annular flat plate that has the same shape as the magnetic member 14 as viewed in plan. The middle member 66b is disposed between the flexible sheet 11 and the magnetic member 14. The outer member 66c is a flat plate that has a hole with an inside diameter that is larger than the outside diameter of the magnetic member 14. The outer member 66c contacts the outer gel Go.

When a magnetic field is applied to the magnetic deformable member 60 and the volume of the space occupied by the gel 13 is varied with the magnetic member 14 and the flexible sheet 11 moved by the application of an external magnetic force, the gel 13 generates a stress that presses the inner member 66a and the flexible sheet 11. When the inner member 66a is pressed from the back surface side of the flexible sheet 11, clear projections and depressions are formed on the front surface 11a of the flexible sheet 11. Hence, with the magnetic deformable member 60 according to the present embodiment, the flexible sheet 11 can be provided with a hand feel with a distinct resistance compared to a configuration in which the gel 13 is directly charged inside the flexible sheet 11.

As viewed in plan, the peripheral edge of the inner member 66a extends along the peripheral edge of the magnetic member 14 on the radially inner side. With the inner member 66a shaped along the magnetic member 14, the reinforcing layer 66 is easily displaceable in the direction of the length of the magnetic member 14 along the boundary of the magnetic member 14. In this way, the position and the degree of projections and depressions caused on the front surface 11a of the flexible sheet 11 when the magnet 15 is caused to approach the back plate 12 are easily controllable. Further, the magnetic member 14 and the reinforcing layer 66 can be formed to be aligned with each other easily when fabricating the magnetic deformable member 60.

The inner member 66a is preferably separated from at least the middle member 66b. With the inner member 66a and the middle member 66b separated from each other, the inner member 66a and the middle member 66b are displaceable independently of each other. When the magnetic deformable member 60 is configured in this way, the front surface 11a can be raised when the magnet 15 is caused to approach the back plate 12, as illustrated in FIG. 18, even if the reinforcing layer 66 is made of a material that is hard enough not to be substantially deformed. In the case where a relatively hard material is used as the material of the reinforcing layer 66, in particular, the contours of projections and depressions on the front surface 11a appear more sharply. Hence, with the magnetic deformable member 60 in this case, a step that is easily sensible to the user can be caused on the front surface 11a.

At least the inner member 66a and the outer member 66c of the reinforcing layer 66 are preferably made of a material that is harder than that of the gel 13. With the reinforcing layer 66 being harder than the gel 13, the reinforcement strength of the reinforcing layer 66 can be enhanced, which achieves the full effect of providing the reinforcing layer 66 discussed above.

At least the inner member 66a and the outer member 66c of the reinforcing layer 66 may be made of a non-magnetic material. The inner member 66a and the outer member 66c which are made of a non-magnetic material are not affected by the magnet 15 which approaches the back plate 12. Therefore, the flexible sheet 11 is not attracted in the direction of depressing toward the back surface side when a magnetic field is applied to the magnetic deformable member 60, which allows the surrounded portion 11d to swell particularly significantly.

The reinforcing layer 66 is preferably made of a rigid material that is not easily deformable even upon receiving a certain pressure. Specific examples of the material include an acrylic resin, polyamide, polyethylene terephthalate, polycarbonate, polypropylene, and high-density polyethylene. The reinforcing layer 66 can be formed by printing an acrylic or polyester ultraviolet-curable resin on the flexible sheet 11 and irradiating the ultraviolet-curable resin with ultraviolet rays, for example. However, the method of forming the reinforcing layer 66 is not specifically limited. For example, the reinforcing layer 66 may be extruded and stacked on the flexible sheet 11, or may be formed into a sheet to be bonded to the flexible sheet 11 using an adhesive.

The magnetic member 14 is secured to the flexible sheet 11 to form an "inner charged portion" of the inner gel Gi on the inner peripheral side of the annular structure of the magnetic member 14. The volume of the "inner charged portion" of the inner gel Gi is smaller than that of an "outer charged portion" on the outer peripheral side of the magnetic member 14 occupied by the outer gel Go. Therefore, the surrounded portion 11d of the flexible sheet 11, which is positioned above the "inner charged portion" of the inner gel Gi, is easily swelled by being pressed by the inner gel Gi compared to a portion of the flexible sheet 11 positioned above the "outer charged portion". Thus, the surrounded portion 11d can be deformed so as to be swelled reliably when an external magnetic force is applied. The magnetic member 14 contacts the back plate 12 in some cases, and does not contact the back plate 12 in the other cases, when the magnetic member 14 is displaced toward the back plate 12 by an external magnetic force. In any case, the surrounded portion 11d can be deformed to be swelled by being pressed by the inner gel Gi.

Modification of Sixth Embodiment

The reinforcing layer 66 may be formed integrally, rather than being divided into the inner member 66a, the middle member 66b, and the outer member 66c. With the reinforcing layer 66 formed integrally, the flexible sheet 11 does not have an annular void portion such as those between the inner member 66a and the middle member 66b and between the middle member 66b and the outer member 66c on the back surface side. In this way, the magnetic deformable member 60 can be provided with a sense of uniformity with no boundary felt when the front surface 11a of the flexible sheet 11 is touched. In this event, the reinforcing layer 66 is preferably flexible enough to be deformed upon receiving the pressure of the gel 13. In this way, a projected portion in which the surrounded portion 11d rises can be formed on the flexible sheet 11, although it is difficult to form clear projections and depressions.

The magnetic member 14 is often more rigid than the gel 13. Therefore, in some cases, the difference in hardness between the magnetic member 14 and the reinforcing layer 66 is not so large as the difference in hardness between the gel 13 and the reinforcing layer 66.

In such cases, the magnetic deformable member 60 may not have the middle member 66b. In other words, it is only necessary that the magnetic deformable member 60 in this event should have the inner member 66a which contacts the inner gel Gi and the outer member 66c which contacts the outer gel Go. Even with such a configuration, the magnetic deformable member 60 can be provided with a sense of uniformity with no boundary felt when the front surface 11a of the flexible sheet 11 is touched. Further, the magnetic deformable member 60 has the inner member 66a. Thus, in the magnetic deformable member 60, clear projections and depressions are formed around the surrounded portion 11d of the flexible sheet 11 when projections and depressions are caused on the flexible sheet 11 by causing the magnet 15 to approach the back plate 12. In this way, the surrounded portion 11d of the flexible sheet 11 can be provided with a hand feel with a distinct resistance compared to a configuration in which the gel 13 is directly charged inside the flexible sheet 11.

Further, the magnetic deformable member 60 may not have the middle member 66b or the outer member 66c. In other words, it is only necessary that the magnetic deformable member 60 in this event should have at least the inner member 66a which contacts the inner gel Gi. In the magnetic deformable member 60, clear projections and depressions are formed around the surrounded portion 11d of the flexible sheet 11 when projections and depressions are caused on the flexible sheet 11 by causing the magnet 15 to approach the back plate 12. In this way, the surrounded portion 11d of the flexible sheet 11 can be provided with a hand feel with a distinct resistance compared to a configuration in which the gel 13 is directly charged inside the flexible sheet 11.

Further, the reinforcing layer 66 may be integrated with the flexible sheet 11. In this event, the flexible sheet 11 may be thickened at positions corresponding to the inner member 66a, the middle member 66b, and the outer member 66c, for example, to be formed similarly to a configuration in which the reinforcing layer 66 is divided into the inner member 66a, the middle member 66b, and the outer member 66c. This is also achieved by providing annular groove portions between the inner member 66a and the middle member 66b and between the middle member 66b and the outer member 66c. With the reinforcing layer 66 integrated with the flexible sheet 11, it is not necessary to separately form the reinforcing layer 66, which can save the trouble of fabricating the reinforcing layer 66 and reduce the number of types of materials.

Figure 19:
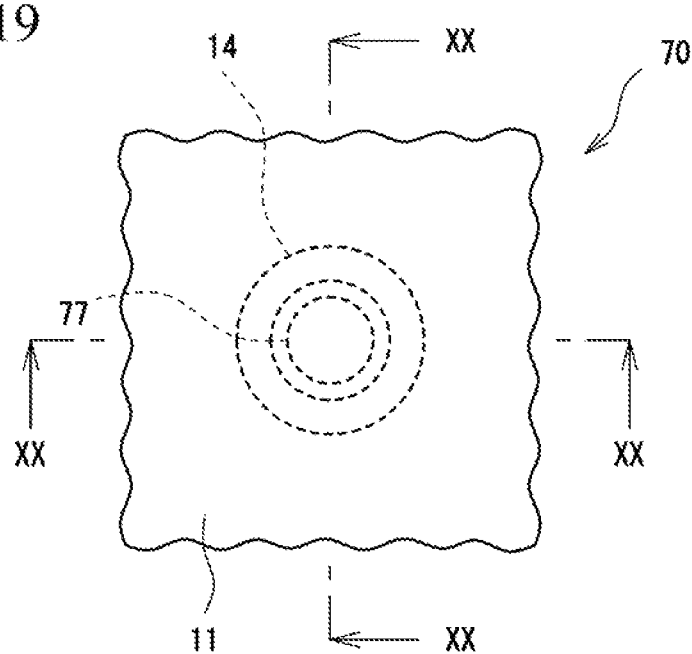
FIG. 19 is a plan view of a magnetic deformable member according to a seventh embodiment.
Figure 20:
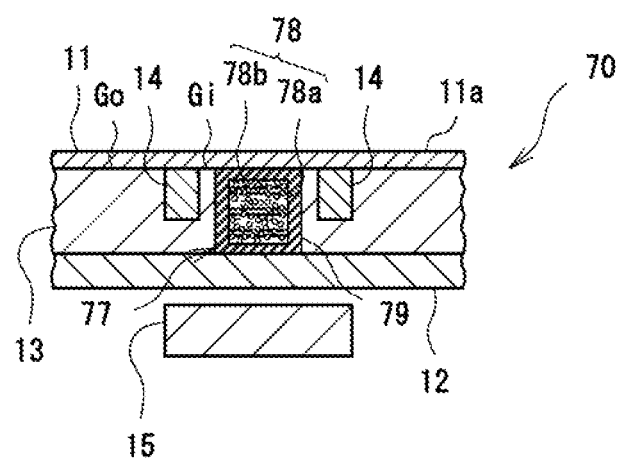
FIG. 20 is a sectional view taken along the line XX-XX in FIG. 19.
Figure 21:
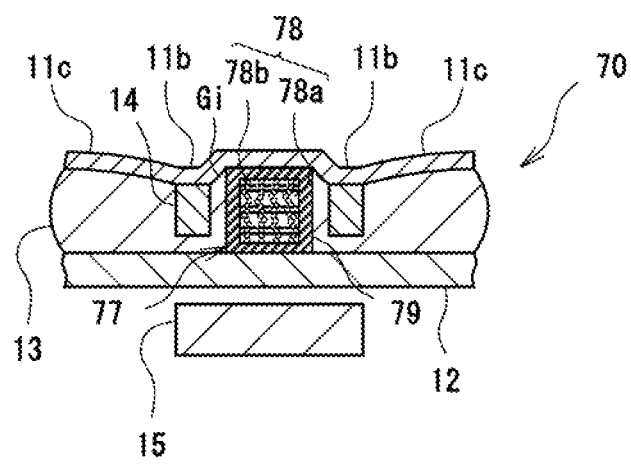
FIG. 21 is a sectional view, corresponding to FIG. 20, of the magnetic deformable member according to the seventh embodiment with application of a magnetic field.

Seventh Embodiment: [FIGS. 19 to 21]

As illustrated in FIGS. 19 and 20, a magnetic deformable member 70 according to the present embodiment has a tactile feel presenting member 77 (pressing feel presenting member) on the inner side of the flexible sheet 11 and the back plate 12 which are stacked on each other. The tactile feel presenting member 77 is a member that enables the user to perceive variations in tactile feel by varying its own nature in response to an external stimulus. The tactile feel that is required as a minimum in the present embodiment is the sense of hardness and softness which is the sense as to whether an object is hard or soft.

In the present embodiment, the magnetic deformable member 70 has the tactile feel presenting member 77, and thus presents the sense of hardness and softness to the user via the flexible sheet 11. In the magnetic deformable member 70 according to the present embodiment, in particular, the tactile feel presenting member 77 is varied to be hard in accordance with formation of projections and depressions on the flexible sheet 11 so that the surrounded portion 11d, which has a soft tactile feel in the normal state in which no magnetic field is applied, for example, can serve as a hard projected portion. Hence, with the magnetic deformable member 70 according to the present embodiment, a hand feel with a distinct resistance can be provided, as necessary, at a desired location of the flexible sheet 11.

In the present embodiment, a magnetic field-responsive fluid 78 is used as a stimulus-responsive substance that varies the rheological properties of the substance itself in response to an external stimulus. As illustrated in FIG. 20, the magnetic field-responsive fluid 78 is a suspension that contains a dispersion medium 78a which is a non-magnetic fluid such as oil, and a dispersoid 78b constituted from magnetic particles such as a soft magnetic material.

When a magnetic field is applied, the magnetic particles of the dispersoid 78b which is dispersed in the dispersion medium 78a are polarized and agglomerated in the direction of the magnetic field to form an infinite number of particle chains (clusters) as illustrated in FIG. 21. Therefore, a resistance due to the collapse of the particle chains is caused against a stress that shears the particle chains and a stress flow that crushes the particle chains in the magnetic field-responsive fluid 78 under the magnetic field, which enhances the apparent viscosity of the magnetic field-responsive fluid 78. Because of the resistance, the magnetic field-responsive fluid 78 exhibits properties similar to those of a Bingham plastic. That is, the magnetic field-responsive fluid 78 is a functional fluid with variable apparent viscosity and tactile feel.

The tactile feel presenting member 77 according to the present embodiment has a bag-shaped flexible film 79. The bag-shaped flexible film 79 is formed in a circular column shape, and has a space portion surrounded by three film surfaces, i.e. upper and lower bottom surfaces and a side surface therebetween, to accommodate a fluid therein. The tactile feel presenting member 77 is constituted by enclosing the magnetic field-responsive fluid 78 in the bag-shaped flexible film 79. The bag-shaped flexible film 79 is so flexible (hard) as to be deformed together with the magnetic field-responsive fluid 78 when pushed by the user from the side of the front surface 11a of the flexible sheet 11.

When the magnetic field-responsive fluid 78 which is enclosed in the bag-shaped flexible film 79 is in the normal state in which no magnetic field is applied, the dispersoid 78b does not form particle chains, and therefore the magnetic field-responsive fluid 78 has its normal flowability (viscosity) that the dispersion medium 78a originally has. Therefore, when the bag-shaped flexible film 79 is pushed in, a resistance due to the collapse of the particle chains of the dispersoid 78b is not caused, and a soft pushing feel is presented. When the magnetic field-responsive fluid 78 which is enclosed in the bag-shaped flexible film 79 is under a magnetic field, on the other hand, the dispersoid 78b forms particle chains, and therefore the apparent viscosity of the magnetic field-responsive fluid 78 is enhanced and the magnetic field-responsive fluid 78 exhibits properties similar to those of a rigid body (solid body). Therefore, when the bag-shaped flexible film 79 is pushed in, a resistance due to the collapse of the particle chains of the dispersoid 78b is caused, and a relatively hard pushing feel is presented.

As illustrated in FIGS. 19 and 20, the bag-shaped flexible film 79 is disposed inside the annular shape of the magnetic member 14. Thus, in the magnetic deformable member 70, when the magnet 15 approaches the back plate 12, a button-shaped swell in which the surrounded portion 11d is projected significantly is formed, and the tactile feel presenting member 77 is hardened. Hence, with the magnetic deformable member 70 in this case, the surrounded portion 11d can be recognized as a button, which improves the operability of a device in which the magnetic deformable member 70 is incorporated.

The tactile feel presenting member 77 is preferably disposed in contact with the back plate 12 in advance. In this way, when the front surface 11a of the flexible sheet 11 is pressed, the external force acts to deform, rather than displace, the tactile feel presenting member 77. Thus, the user continuously receives a stress from the tactile feel presenting member 77 itself, rather than receives a stress from the gel 13 as the tactile feel presenting member 77 is displaced, while the tactile feel presenting member 77 is being pushed in, which allows the user to effectively sense the feel of the tactile feel presenting member 77.

On the other hand, the tactile feel presenting member 77 may be disposed such that the lower bottom surface thereof does not contact the back plate 12. With such a configuration, the tactile feel presenting member 77 can be displaced until the tactile feel presenting member 77 contacts the back plate 12 when the front surface 11a of the flexible sheet 11 is pressed. Thus, the tactile feel presenting member 77 can provide a soft tactile feel.

The material of the dispersion medium 78a is not specifically limited as long as the dispersion medium 78a is a flowable fluid that allows the dispersoid 78b to be dispersed therein. The dispersion medium 78a may be provided with a surface active agent in order to allow the dispersoid 78b to be stably dispersed therein, for example. The material of the dispersoid 78b is not specifically limited as long as the dispersoid 78b is a magnetic material that can be polarized to form particle chains in a magnetic field. The material of the bag-shaped flexible film 79 is not specifically limited as long as the bag-shaped flexible film 79 can accommodate the magnetic field-responsive fluid 78 stably without causing a reaction. Further, the bag-shaped flexible film 79 is preferably thick and hard enough not to be deformed in the case where the bag-shaped flexible film 79 is pushed with an external force that is equal to or less than the yield shearing stress of the magnetic field-responsive fluid 78 which has been hardened under a magnetic field. In this way, the feel of the tactile feel presenting member 77 can be sensed effectively.

The tactile feel presenting member 77 is not limited to being enclosed in the bag-shaped flexible film 79, and may be directly charged between the flexible sheet 11 and the back plate 12. Further, the magnetic deformable member 70 uses a magnetic field, and therefore the magnetic field-responsive fluid 78 is preferably used as the stimulus-responsive substance. However, the stimulus-responsive substance may be a material, the nature of which is varied in response to a physical stimulus in temperature, light, electric field, etc. or variations in chemical environment such as pH, concentration of a chemical substance, etc. besides magnetic field.

The tactile feel presenting member 77 in the normal state in which no magnetic field is applied is often softer than the magnetic member 14. Therefore, the reinforcing layer 66 such as that illustrated in FIGS. 16 to 18 may be provided between the magnetic member 14, the gel 13, and the tactile feel presenting member 77 and the flexible sheet 11.

When the magnetic deformable member 70 has the reinforcing layer 66 which is harder than at least the tactile feel presenting member 77 in the normal state, for example, the tactile feel of the reinforcing layer 66 is presented from the side of the front surface 11a of the flexible sheet 11 even if the tactile feel presenting member 77 is flexible. In this manner, even in the case where there is a difference in tactile feel between the tactile feel presenting member 77 in the normal state and the magnetic member 14 and the gel 13, the magnetic deformable member 70 can make it difficult for the user to sense such a difference in tactile feel because of the intervention of the reinforcing layer 66. Hence, the magnetic deformable member 70 can be provided with a sense of uniformity that does not allow one to easily feel the boundary on the front surface 11a of the flexible sheet 11 in the normal state in which no magnetic field is applied. Further, the magnetic deformable member 70 can be provided with a good appearance, since the reinforcing layer 66 is at least hard enough to have shape holding properties and the surrounded portion 11d is not kept depressed.

Figure 1:
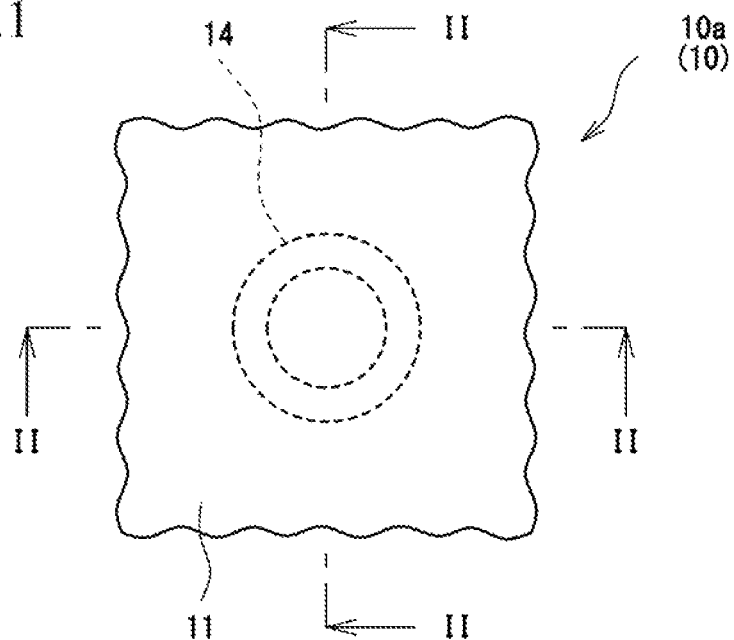
FIG. 1 is a plan view of a magnetic deformable member according to a first embodiment.

In the preceding embodiment, the magnetic member 14 has an endless, closed annular shape, as illustrated in FIG. 1, as an example of the annular shape as viewed in plan. However, the annular shape is not limited to such an example. Examples of the annular shape include an open annular shape as illustrated in FIG. 15. The shape of the magnetic member 14 is not limited to a circular shape, and may be a polygonal shape or any other desired annular shape.

Further, the magnetic member 14 can be formed from a plurality of rigid magnetic pieces arranged in an annular shape. If a plurality of magnetic pieces are arranged in an annular shape, the magnetic pieces can be deformed in the diameter reducing direction as a whole in the case where the magnet 15 has a small outer size, even if the magnetic pieces are rigid. Since the annular shape is not closed, the stress of the inner gel Gi is relieved through the gaps between the magnetic pieces. However, such a relieving effect is excelled by the effect of increasing the stress on the surrounded portion 11d of the flexible sheet 11, achieving the effect of distinguishing the projected portion. Thus, such a magnetic member 14 formed from a plurality of pieces is preferable compared to the simple magnetic member 14 of a single rigid piece, which is not deformed in the diameter reducing direction when the magnet 15 has a small outer size.

An advantage of using a plurality of rigid magnetic pieces is that magnetism can be enhanced drastically, compared to the magnetic member which is obtained by dispersing ferromagnetic powder in a binder, since the magnetic member is formed from one material only. Thus, the surrounded portion 11d can be swelled equally to a case where ferromagnetic powder is dispersed in a binder using a smaller magnet 15 (or a magnet 15 with a smaller magnetic force). Alternatively, the magnetic member 14 can be made smaller in order to obtain an equivalent swell, which is effective in reducing the size of the magnetic deformable member 10a.

The above embodiments are illustrative of the present invention. The embodiments may be modified, the related art may be added thereto, and the embodiments may be combined with each other without departing from the scope and spirit of the present invention. The resulting technologies also fall within the scope of the present invention.

What is claimed is:

1. A magnetic deformable member comprising: a container body that has a deformable flexible film; a gel that has flexibility and is charged in the container body; and a magnetic member held on a back surface side of the flexible film inside the container body, wherein the flexible film is displaceable together with the magnetic member which is moved by an external magnetic force, and has a deformable front surface, wherein the container body includes a flexible sheet that serves as the flexible film, and a support member disposed to face the flexible sheet to support the flexible sheet, wherein a buffer portion is provided between the magnetic member and the flexible sheet.

2. The magnetic deformable member according to claim 1,
wherein the magnetic member has an annular shape as viewed in plan in a direction that is perpendicular to the flexible sheet and has a length in the perpendicular direction.

3. The magnetic deformable member according to claim 1,
wherein the magnetic member has an endless annular shape.

4. The magnetic deformable member according to claim 1,
wherein the magnetic member includes a plurality of magnetic pieces arranged in an annular shape.

5. The magnetic deformable member according to claim 1,
wherein the magnetic member is a deformable elastic member disposed in contact with the support member.

6. The magnetic deformable member according to claim 1, further comprising:
a magnetic force generation member provided on an outer side of the support member to attract the magnetic member using a magnetic force.

7. The magnetic deformable member according to claim 6,
wherein the magnetic force generation member is smaller in outer shape than the magnetic member as viewed in plan.

8. The magnetic deformable member according to claim 1,
wherein the flexible sheet includes a sensor that detects contact.

9. The magnetic deformable member according to claim 1,
wherein the support member includes a sensor that detects contact.

10. The magnetic deformable member according to claim 9,
wherein the sensor is a capacitive sensor, and the gel is a conductive gel.

11. The magnetic deformable member according to claim 9,
wherein the sensor is a capacitive sensor, and the magnetic member is a conductive gel.

12. The magnetic deformable member according to claim 9,
wherein the flexible sheet is a conductive sheet, and the sensor is electrically insulated from the conductive gel.

13. The magnetic deformable member according to claim 9,
wherein the flexible sheet is an insulating layer, and the sensor is electrically connected to the conductive gel.

14. The magnetic deformable member according to claim 1, further comprising:
an outer wall provided on an outer side of the magnetic member to connect the flexible sheet and the support member to each other, the outer wall having a frame shape and being formed from a hard material.

15. The magnetic deformable member according to claim 1,
wherein a reinforcing layer is provided on a back surface side of the flexible sheet.

16. The magnetic deformable member according to claim 1,
wherein a tactile feel presenting member with a tactile feel that is variable in accordance with magnetic field orientation applied by the magnetic member is provided on a back surface side of the flexible sheet.

17. The magnetic deformable member according to claim 1,
wherein a material of the gel has a hardness value of 50 or less, the hardness value is E hardness that is measured by a hardness meter of a type E of Japan Industrial Standard (JIS) K 6253.

18. The magnetic deformable member according to claim 1,
wherein the support member is made of a material that is at least harder than the flexible sheet and the gel.

* * * * *